United States Patent
Yasukawa

(10) Patent No.: US 8,035,987 B2
(45) Date of Patent: Oct. 11, 2011

(54) ELECTRONIC DEVICE HAVING A GROOVE PARTITIONING FUNCTIONAL AND MOUNTING PARTS FROM EACH OTHER

(75) Inventor: Hirohisa Yasukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 852 days.

(21) Appl. No.: 11/705,393

(22) Filed: Feb. 12, 2007

(65) Prior Publication Data
US 2007/0206367 A1 Sep. 6, 2007

(30) Foreign Application Priority Data
Feb. 24, 2006 (JP) ................................. 2006-049026

(51) Int. Cl.
*H05K 7/02* (2006.01)
(52) U.S. Cl. ........ 361/810; 361/760; 361/807; 361/809; 174/262
(58) Field of Classification Search .................. 361/760, 361/761, 792, 807, 809, 774, 810, 728–733, 361/736, 784, 748, 749, 783, 803, 679.01; 174/250, 254, 255, 260–266
See application file for complete search history.

(56) References Cited

U.S. PATENT DOCUMENTS

| | | | | |
|---|---|---|---|---|
| 6,141,471 A * | 10/2000 | Agatsuma | ....................... | 385/49 |
| 6,790,064 B2 * | 9/2004 | Kajiwara | ...................... | 439/259 |
| 6,900,393 B1 * | 5/2005 | Cachina et al. | ............... | 174/260 |
| 2001/0002163 A1 * | 5/2001 | Imasu et al. | .................. | 361/783 |
| 2003/0117784 A1 * | 6/2003 | Fukunabe et al. | ............ | 361/760 |

FOREIGN PATENT DOCUMENTS

| | | |
|---|---|---|
| JP | 02-240942 | 9/1990 |
| JP | 09-068599 | 3/1997 |
| JP | 09-301796 | 11/1997 |
| JP | 11-260960 | 9/1999 |
| JP | 2002-299370 | 10/2002 |
| JP | 2003-179291 | 6/2003 |
| JP | 2004-128492 | 4/2004 |
| JP | 2004-252123 | 9/2004 |
| JP | 2005-150220 | 6/2005 |

* cited by examiner

*Primary Examiner* — Hoa C Nguyen
(74) *Attorney, Agent, or Firm* — Robert J. Depke; Rockey, Depke & Lyons, LLC

(57) ABSTRACT

Disclosed herein is an electronic device which includes a functional part provided in a housing. In a mounting surface of the housing, a mounting part is provided on the side of a side end of the housing with respect to a position corresponding to the functional part, and the mounting surface of the housing is provided with a groove for partitioning from each other the mounting part and a region corresponding to the functional part.

5 Claims, 16 Drawing Sheets

| | 1 | 2 | 3 | 4 | 5 | 6 | 7 | 8 | 9 | 10 | 11 | 12 | 13 |
| --- | --- | --- | --- | --- | --- | --- | --- | --- | --- | --- | --- | --- | --- |
| | A | B | C | D | E | F | G | H | I | J | K | L | M |
| A-A' | -75.53 | -80.98 | -83.78 | -85.08 | -85.66 | -85.83 | -85.86 | -85.81 | -85.62 | -85.03 | -83.72 | -80.91 | -75.45 |
| B-B' | -71.73 | -155.15 | -100.44 | -88.30 | -86.43 | -85.93 | -85.86 | -85.88 | -86.31 | -88.04 | -100.03 | -154.82 | -71.42 |

FIG.31
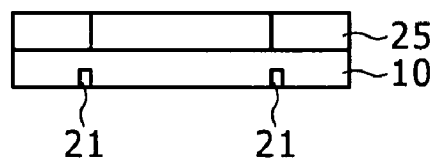
FIG.32
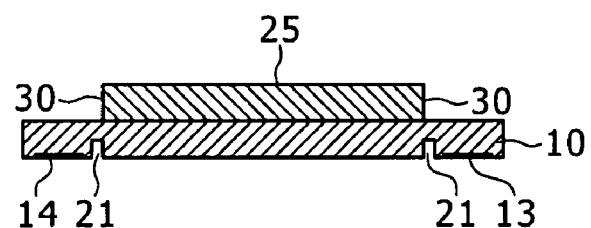
FIG.33
FIG.34A              FIG.34B
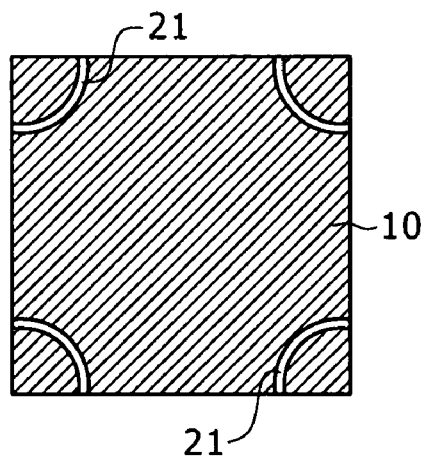   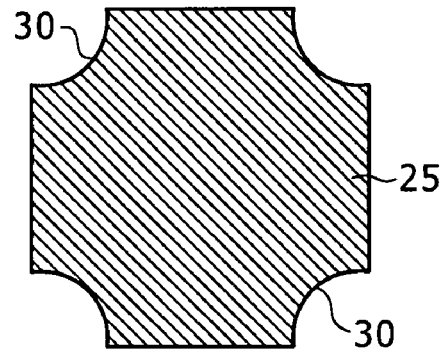

ELECTRONIC DEVICE HAVING A GROOVE PARTITIONING FUNCTIONAL AND MOUNTING PARTS FROM EACH OTHER

CROSS REFERENCES TO RELATED APPLICATIONS

The present invention contains subject matter related to Japanese Patent Application JP 2006-049026 filed in the Japanese Patent Office on Feb. 24, 2006, the entire contents of which being incorporated herein by reference.

BACKGROUND OF THE INVENTION

1. Field of the Invention

The present invention relates to an electronic device, particularly to an electronic device having a functional part provided in a housing, in which the functional part is a micromachine, a semiconductor device, or an IC (integrated circuit device).

2. Description of the Related Art

A micromachine, a semiconductor device, or an IC is obtained by processing a wafer formed from a material (base material) such as silicon and GaAs. Such an electronic device has been so designed as to perform a predetermined operation by passing an electric current therein through electrodes, in the state of being mounted in a ceramic package or on a mounting substrate by use of an adhesive or a solder. Therefore, there is a need to mount the electronic device in the ceramic package or on the mounting substrate. In this case, a stress or warp is generated in a functional part, due to the stress in the adhesive or solder or due to the difference between the coefficient of linear expansion of the adhesive or solder and that of silicon or GaAs used as the material of the functional part upon a change in temperature. If such a stress is not relaxed, there is possibility that desired characteristics cannot be obtained from the electronic device or the electronic device would not perform its original operation.

An example of an electronic device according to the related art will be described referring to FIGS. 35 to 41. An electronic device in which the functional part is a micromachine, for example, is configured by applying predetermined processes to a wafer formed from silicon or GaAs, and, as shown in FIG. 35, has a housing 1 which is a flat substantially rectangular parallelepiped in shape. As shown in FIG. 36, the micromachine as the functional part 2 is provided at a substantially central portion of the housing 1. The lower surface of the housing 1 is a mounting surface 3 as shown in FIG. 37, and, for example, an adhesive 4 is applied to a substantially central portion of the mounting surface 3, whereby the housing 1 is mounted, for example, in a ceramic package and fixed. Incidentally, FIGS. 39 to 41 show the shapes of sections of the housing 1, in which FIG. 39 is a sectional view taken along line A-A of FIG. 36, FIG. 40 is a sectional view taken along line B-B of FIG. 36, and FIG. 41 is a horizontal sectional view of the housing 1.

Thus, the electronic device, in the condition where, for example, the adhesive 4 or solder is applied to a substantially central portion of the mounting surface 3 thereof and the micromachine as the functional part 2 is disposed on the adhesive 4 or the solder, is mounted, for example, in a ceramic package.

In the electronic device according to the related art as above-mentioned, the adhesive 4 or solder on the mounting surface 3 is beneath the functional part 2. Therefore, there has been the problem that a stress or warp is generated in the functional part such as a micromachine, a semiconductor device, an IC, etc. due to the stress of the adhesive or solder upon mounting or a stress generated due to the difference between the coefficient of linear expansion of the adhesive or solder and that of silicon or GaAs used as the material of the functional part, and the stress or warp influences the electrical characteristics of the functional part 2 constituting a central part or heart of the electronic device. Specifically, in the case where the electronic device is mounted in a ceramic package or on a mounting substrate by the adhesive 4 or solder applied to a central portion thereof, as shown in FIGS. 42A and 42B, there occurs a deformation such that a peripheral portion of the housing 4 is warped to the upper side. Attendant on such a deformation, a warp is generated as shown in FIGS. 43 and 44. This warp results from the stress of the adhesive or solder or from the stress generated due to the difference between the coefficient of linear expansion of the adhesive or solder and that of silicon or GaAs used to form the functional part upon a change in temperature.

An example of the influence exerted on the electrical characteristics of an electronic device by such a warp or a stress causing a warp will now be described by use of the principle of detection of acceleration by a micromachine. In the case of a piezoresistance type detection type, there is established:

$$\Delta R = \Pi \cdot \sigma \cdot R$$

Where $\Delta R$ is variation in resistance, $\Pi$ is coefficient of piezoresistance, $\sigma$ is stress, and $R$ is resistance.

In the case of a capacitance (electrostatic capacity) type detection type, the capacitance is given by:

$$C = \in \cdot S/d$$

Where $C$ is capacitance, $\in$ is dielectric constant, $S$ is electrode area, and $d$ is the distance between electrodes.

In the case of the piezoresistance type detection type, the variation in resistance according to the magnitude of stress $\sigma$ is outputted, whereas in the case of the capacitance type detection type, the capacitance inversely proportional to the distance between electrodes, d, is outputted. Therefore, when a stress or warp is generated in the functional part, the electrical characteristics of the micromachine are influenced.

Incidentally, where the magnitude of the stress generated in the functional part due to the adhesive or solder upon mounting or due to the difference between the coefficient of linear expansion of the adhesive or solder and that of silicon or GaAs used as the material of the functional part upon a change in temperature is constant, the distortion (warp) due to the stress decreases in proportion to the cube of the thickness of the material. Hence:

$$\rho = \sigma/(E \cdot t3)$$

where $\rho$ is distortion (warp), $E$ is Young's modulus, $t$ is thickness, and $\sigma$ is stress.

As is clear from the above formula, when the thickness t of silicon or GaAs used as a material of the micromachine is increased, the stress generated in the functional part due to the stress of the adhesive or solder upon mounting or due to the difference between the coefficient of linear expansion of the adhesive or solder and that of silicon or GaAs used as the material of the functional part upon a change in temperature can be reduced to such a level as not to influence the electrical characteristics of the micromachine.

However, attendant on the progress of personal digital assistants and the need for reductions in weight and thickness of electronic and electric apparatuses, in recent years, there is a demand for a further reduction in thickness of electronic devices to be mounted on the electronic and electric apparatuses, and, therefore, the measure of increasing the thickness t of silicon or GaAs as a material of a micromachine is contrary to the further reduction in the thickness of electronic devices.

[Patent Document 1]
Japanese Patent No. 3167098
[Patent Document 2]
Japanese Patent Laid-Open No. 2004-128492
[Patent Document 3]
Japanese Patent Laid-Open No. 2004-252123
[Patent Document 4]
Japanese Patent Laid-Open No. Hei 9-301796

SUMMARY OF THE INVENTION

Thus, there is a need for an electronic device having a functional part in a housing such that upon the electronic device in a ceramic package or on a mounting substrate, the electric characteristics of the functional part such as a micromachine, a semiconductor device, an IC, etc. would not be influenced by the stress of an adhesive or solder or by the stress generated due to the difference between the coefficient of linear expansion of the adhesive or solder and that of silicon or GaAs used for forming the functional part upon a change in temperature.

This need will be made clear by the technical thought of the present invention and modes of carrying out the invention which will be described below.

A principal invention in the present patent application pertains to an electronic device including a functional part provided in a housing. In a mounting surface of the housing, a mounting part is provided on the side of a side end of the housing with respect to a position corresponding to the functional part, and the mounting surface of the housing is provided with a groove for partitioning from each other the mounting part and a region corresponding to the functional part.

Here, the functional part may be a micromachine. Also, the functional part may be a semiconductor device. Further, the functional part may be an IC (integrated circuit device). In addition, preferably, the groove has a depth of not less than ⅙ times the thickness in a direction orthogonal to the mounting surface of the housing. Besides, the housing may be a flat rectangular parallelepiped in shape, wherein one principal surface of the housing constitutes the mounting surface, and the mounting part is provided in the vicinity of a corner part of the mounting surface.

Another principal invention in the present patent application pertains to an electronic device including a functional part in a housing. In a mounting surface of the housing, a mounting part is provided on the side of a side end of the housing with respect to a position corresponding to the functional part, and a first groove is provided for partitioning from each other the mounting part and a region corresponding to the functional part; and, further, a second groove is provided on the side of the center of the mounting surface so as to surround the mounting part.

Here, the functional part may be a micromachine. Also, the functional part may be a semiconductor device. Further, the functional part may be an IC (integrated circuit device). In addition, preferably, the groove has a depth of not less than ⅙ times the thickness in a direction orthogonal to the mounting surface of the housing.

A further principal invention in the present patent application pertains to an electronic device including a plurality of housings joined to each other, and functional parts provided respectively in the housings. In a mounting surface of the housing on the mounting side, a mounting part is provided on the side of a side end of the housing with respect to a position corresponding to the functional part, and the housing is provided with a groove for partitioning from each other the mounting part and a region corresponding to the functional part; and, further, the housing on the other side is provided with a groove corresponding to the groove in the housing on the mounting side, in mirror plane symmetry with respect to a housing joint surface.

Here, the functional part may be a micromachine. Also, the functional part may be a semiconductor device. Further, the functional part may be an IC (integrated circuit device). In addition, preferably, the groove has a depth of not less than ⅙ times the thickness in a direction orthogonal to the mounting surface of the housing.

Yet another principal invention in the present patent application pertains to an electronic device including a plurality of housings joined to each other, and functional parts provided respectively in the housings. In a mounting surface of the housing on the mounting side, a mounting part is provided on the side of a side end of the housing with respect to a position corresponding to the functional part, and the housing is provided with a groove for partitioning from each other the mounting part and a region corresponding to the functional part; and, further, the housing on the other side lacks a region ranging toward the mounting part from a position corresponding to the groove in mirror symmetry with respect to a housing joint surface.

Here, the functional part may be a micromachine. Also, the functional part may be a semiconductor device. Further, the functional part may be an IC (integrated circuit device). In addition, preferably, the groove has a depth of not less than ⅙ times the thickness in a direction orthogonal to the mounting surface of the housing.

Incidentally, in each of the inventions, the housing refers to an outside shape part of a functional part in an electronic device. For example, where the functional part is a micromachine, the outside shape part of the functional part, i.e., the micromachine and its material part (e.g., silicon, GaAs or the like), correspond to the housing. Also, a package of a ceramic package or the like corresponds to the housing. Similarly, where the functional part is a semiconductor device or an IC, an outside shape part of the functional part corresponds to the housing.

An electronic device structure according to a preferred mode of the present invention is an electronic device wherein a groove having a depth of not less than ⅙ times the thickness of the electronic device is provided in the periphery of and in the same surface as an adhesive- or solder-coated part of a mounting surface of a housing of the electronic device.

The groove having a depth of not less than ⅙ times the thickness of the electronic device, which is provided in the periphery of and in the same surface as the adhesive- or solder-coated part of the mounting surface of the electronic device, locally consumes a stress of the adhesive or solder upon of the electronic device or a stress generated due to the difference between the coefficient of linear expansion of the adhesive or solder and that of silicon or GaAs used as a material of the functional part upon a change in temperature, whereby generation of a stress in the functional part and warping of the functional part can be effectively prevented. As a result, it is possible to manufacture and supply an electronic device in which electrical characteristics of a functional part are less liable to be influenced by the stress of an adhesive or solder upon the electronic device or by the stress generated due to the difference between the coefficient of linear expansion of the adhesive or solder and that of silicon or GaAs used as a material of the functional part upon a change in temperature.

Now, modes included in the present invention will be mentioned below.

Mode 1

An electronic device wherein a functional part is a micromachine, a mounting part is provided in the same surface as a mounting surface of a housing of the electronic device, and a groove having a depth of not less than $1/6$ times the thickness of the housing is provided so as to partition the mounting part and a region corresponding to the functional part from each other.

Mode 2

An electronic device wherein a functional part is a semiconductor device, a mounting part is provided in the same surface as a mounting surface of a housing of the electronic device, and a groove having a depth of not less than $1/6$ times the thickness of the housing is provided so as to partition the mounting part and a region corresponding to the functional part from each other.

Mode 3

An electronic device wherein a functional part is an IC, a mounting part is provided in the same surface as a mounting surface of a housing of the IC, and a groove having a depth of not less than $1/6$ times the thickness of the housing is provided so as to partition the mounting part and a region corresponding to the functional part from each other.

Mode 4

An electronic device wherein a functional part is a micromachine, a mounting part is provided in the periphery of and in the same surface as a mounting surface of a housing of the electronic device, and a groove having a depth of not less than $1/6$ times the thickness of the housing is provided so as to partition the mounting part and a region corresponding to the functional part from each other.

Mode 5

An electronic device wherein a functional part is a semiconductor device, a mounting part is provided in the periphery of and in the same surface as a mounting surface of a housing of the electronic device, and a groove having a depth of not less than $1/6$ times the thickness of the housing is provided so as to partition the mounting part and a region corresponding to the functional part from each other.

Mode 6

An electronic device wherein a functional part is an IC, a mounting part is provided in the periphery of and in the same surface as a mounting surface of a housing of the electronic device, and a groove having a depth of not less than $1/6$ times the thickness of the housing is provided so as to partition the mounting part and a region corresponding to the functional part from each other.

Mode 7

An electronic device wherein a functional part is a micromachine, mounting parts are provided at four corners of and in the same surface as a mounting surface of a housing of the electronic device, and a groove having a depth of not less than $1/6$ times the thickness of the housing is provided so as to partition the mounting part and a region corresponding to the functional part from each other.

Mode 8

An electronic device wherein a functional part is a semiconductor part, mounting parts are provided at four corners of and in the same surface as a mounting surface of a housing of the electronic device, and a groove having a depth of not less than $1/6$ times the thickness of the housing is provided so as to partition the mounting part and a region corresponding to the functional part from each other.

Mode 9

An electronic device wherein a functional part is an IC, mounting parts are provided at four corners of and in the same surface as a mounting surface of a housing of the electronic device, and a groove having a depth of not less than $1/6$ times the thickness of the housing is provided so as to partition the mounting part and a region corresponding to the functional part from each other.

Mode 10

An electronic device wherein a functional part is a micromachine, a mounting part is provided in the periphery of and in the same surface as a mounting surface of a housing of the electronic device, a first groove having a depth of not less than $1/6$ times the thickness of the housing is provided so as to partition the mounting part and a region corresponding to the functional part from each other, and, further, a second groove having a depth of not less than $1/6$ times the thickness of the housing is provided on the center side of the mounting surface so as to surround the functional part.

Mode 11

An electronic device wherein a functional part is a micromachine, mounting parts are provided at four corners of and in the same surface as a mounting surface of a housing of the electronic device, a first groove having a depth of not less than $1/6$ times the thickness of the housing is provided so as to partition the mounting parts and a region corresponding to the functional part from each other, and, further, a second groove having a depth of not less than $1/6$ times the thickness of the housing is provided on the center side of the mounting surface so as to surround the functional part.

Mode 12

An electronic device including a plurality of housings joined to each other, and functional parts provided respectively in the housings, wherein a functional part of the electronic device is a micromachine, a mounting part is provided in the periphery of and in the same surface as a mounting surface of the housing of the electronic device, a first groove having a depth of not less than $1/6$ times the thickness of the housing is provided so as to partition the mounting part and a region corresponding to the functional part from each other, and, further, a second groove having a depth of not less than the thickness of the housing is provided in the other housing in mirror symmetry with respect to a joint surface of the housings.

Mode 13

An electronic device including a plurality of housings joined to each other, and functional parts provided respectively in the housings, wherein a functional part of the electronic device is a micromachine, a mounting part is provided in the periphery of and in the same surface as a mounting surface of the housing of the electronic device, a groove having a depth of not less than $1/6$ times the thickness of the housing is provided so as to partition the mounting part and a region corresponding to the functional part from each other, and, further, the other housing lacks a region ranging toward the mounting part from a position corresponding to the groove in mirror symmetry with respect to a joint surface of the housings.

Mode 14

An electronic device including a plurality of housings joined to each other, and functional parts provided respectively in the housings, wherein a functional part of the electronic device is a micromachine, mounting parts are provided at four corners of and in the same surface as a mounting surface of the housing of the electronic device, a first groove having a depth of not less than ⅙ times the thickness of the housing is provided so as to partition the mounting part and a region corresponding to the functional part from each other, and, further, the other housing is provided with a second groove having a depth of not less than ⅙ times the thickness of the housing in mirror symmetry with respect to a joint surface of the housings.

Mode 15

An electronic device including a plurality of housings joined to each other, and functional parts provided respectively in the housings, wherein a functional part of the electronic device is a micromachine, mounting parts are provided at four corners of and in the same surface as a mounting surface of the housing of the electronic device, a groove having a depth of not less than ⅙ times the thickness of the housing is provided so as to partition the mounting part and a region corresponding to the functional part from each other, and, further, the other housing lacks a region ranging toward the mounting part from a position corresponding to the groove in mirror symmetry with respect to a joint surface of the housings.

Mode 16

An electronic device having a micromachine as a functional part described in any of Modes 1, 4, 7, and 10 to 15, wherein the functional part is a micromachine of a sensor.

Mode 17

An electronic device having a micromachine as a functional part described in any of Modes 1, 4, 7, and 10 to 15, wherein the functional part is a micromachine of an RF filter.

Mode 18

An electrical or electronic apparatus in which an electronic device described in any of Modes 1 to 17 is mounted.

Principal inventions in the present application pertain to an electronic device having a functional part provided in a housing, wherein in a mounting surface of a housing, a mounting part is provided on the side of a side end of the housing with respect to a position corresponding to the functional part, and a groove for portioning from each other the mounting part and a region corresponding to the functional part is provided.

According to the electronic device as just-mentioned, the groove partitioning the mounting part and the region corresponding to the functional part prevents a stress generated in the mounting part from being transmitted to the functional part. Therefore, it is possible to provide an electronic device with low possibility that electrical characteristics of the functional part such as a micromachine, a semiconductor device, an IC, etc. might be influenced by a stress generated in the functional part due to a stress of an adhesive or solder upon mounting or due to the difference between the coefficient of linear expansion of the adhesive or solder and that of silicon or GaAs used as a material of the functional part upon a change in temperature.

BRIEF DESCRIPTION OF THE DRAWINGS

FIG. 31 is a side view of the device;
FIG. 32 is a sectional view taken along line A-A of FIG. 29 of the device;
FIG. 33 is a sectional view taken along line B-B of FIG. 29 of the device;
FIGS. 34A and 34B show horizontal sectional views of silicon chips.

DETAILED DESCRIPTION OF THE PREFERRED EMBODIMENTS

Now, the present invention will be described below referring to embodiments thereof shown in the accompanying drawings. The following embodiments will be described by taking an example in which the functional part of an electronic device obtained by processing a wafer formed from silicon or GaAs is a micromachine, but the present invention is not limited to the case where the functional part is a micromachine and may also be applied to the cases where the functional part is a semiconductor device or an IC (integrated circuit device) A configuration and a manufacturing method of an electronic device such that, in the case where the functional part of the electronic device is a micromachine, the electrical characteristics of the functional part is less liable to be influenced by a stress of an adhesive or solder or a stress generated due to the difference between the coefficient of linear expansion of the adhesive or solder and that of silicon or GaAs used as a material of the function part, when the electronic device is mounted in a ceramic casing or on a mounting substrate, will be described.

Embodiment 1

Figure 1:
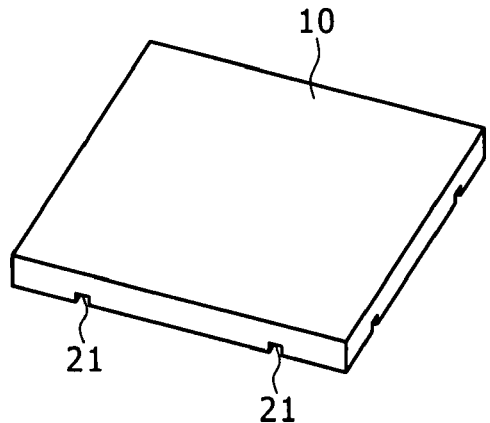
FIG. 1 is a perspective view of a device including a micromachine according to a first embodiment of the present invention.
Figure 2:
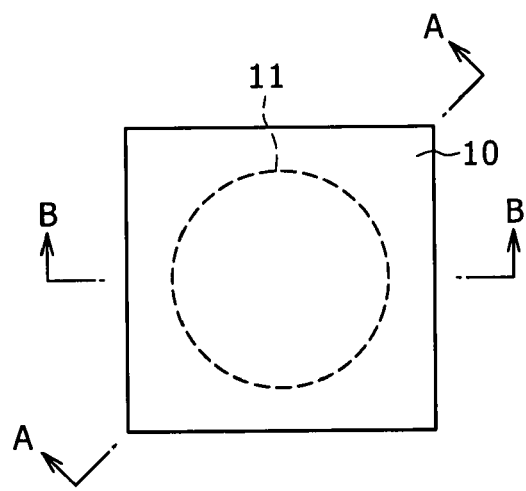
FIG. 2 is a plan view of the device.

A first embodiment will be described referring to FIGS. 1 to 7. This embodiment pertains to an electronic device in which the functional part is a micromachine and the outside shape of which is given by a flat rectangular parallelepiped housing 10, as shown in FIG. 1. Incidentally, the housing 10 here is obtained by separately cutting a silicon wafer to into substantially square shaped pieces. As shown in FIG. 2, a functional part 11 is formed at a substantially central portion of the housing 10. The surface, on the opposite side of the surface shown in FIG. 2, of the housing 10 is a mounting surface 12, and, as is clear from FIG. 3, the mounting surface 12 is provided at four corner parts thereof with recessed parts 13 having a fan-like shape with a center angle of 90 degrees. The recessed parts 13 are filled with an adhesive 14, with which the electronic device will be mounted in a ceramic package or on a mounting substrate. In the electronic device, a groove 21 is provided so as to surround each mounting part composed of the recessed part 13. The grooves 21 are so laid out as to partition the mounting parts composed of the recessed parts 13 and a position corresponding to the functional part 11, of the housing 10, from each other.

Figure 3:
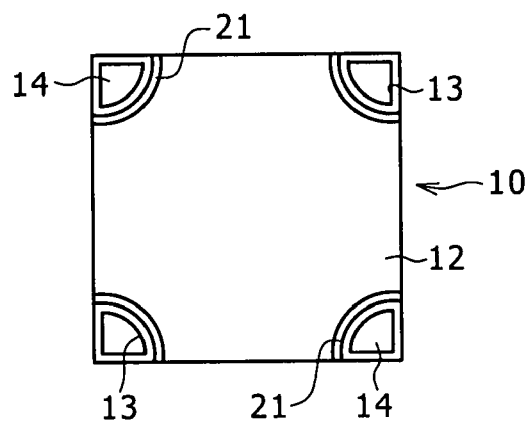
FIG. 3 is a bottom view of the device.
Figure 4:
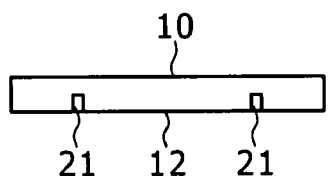
FIG. 4 is a side view of the device.
Figure 5:
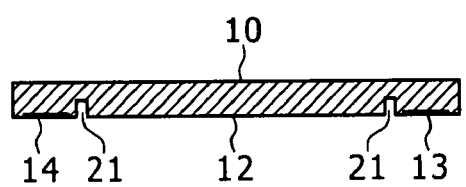
FIG. 5 is a sectional view taken along line A-A of FIG. 2 of the device.
Figure 6:
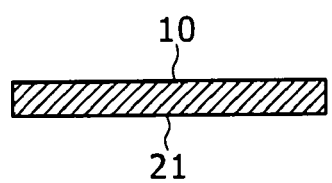
FIG. 6 is a sectional view taken along line B-B of FIG. 2 of the device.
Figure 7:
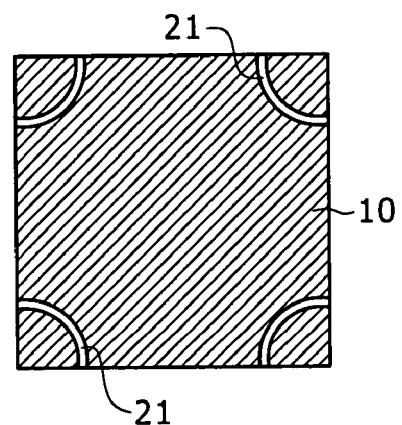
FIG. 7 is a horizontal sectional view of the device.

Thus, in the micromachine according to this embodiment, the functional part 11 is provided at a central portion, and parts to be coated with an adhesive or solder are laid out at four corner parts of the mounting surface 12 of the housing 10. The same surface as the mounting surface 12 is provided, between the region corresponding to the functional part 11 and the adhesive- or solder-coated parts, with the grooves 21 having a depth of not less than ⅙ times the thickness of the housing 10. Incidentally, in this embodiment, as the shape of the housing 10 of the micromachine is shown in FIGS. 2 and 3, the shape is substantially square, but the micromachine may be rectangular in shape.

In addition, while the shape of the grooves 21 in this micromachine is an arcuate shape with a center angle of 90 degrees, a rectilinear shape may also be adopted. Besides, the formation of the grooves 21 may be conducted by a deep silicon etching method, for example, a D-RIE (Deep Reactive Ion Etching) method, a TMAH (Tetramethyl ammonium hydroxide) method or a KOH (potassium hydroxide) method. In addition, the processing of the grooves 21 may be conducted simultaneously with or independently from the processing of the functional part 11 of the housing 10.

Here, the grooves 21 formed by any of the above-mentioned methods should have a depth of not less than ⅙ times the thickness, in the direction orthogonal to the mounting surface 12, of the housing 10. Where the depth of the grooves 21 is less than ⅙ times the thickness of the housing 10, there is obtained little effect of mitigating the deformation or stress of the functional part 11. On the other hand, it has been confirmed that, where the depth of the grooves 21 is not less than ⅙ times the thickness of the housing 10, a deformation- or stress-suppressing effect is produced by the grooves 21. More preferably, the grooves have a depth of not less than ⅓ times the thickness of the housing 10. It has been confirmed that, where the depth of the grooves is not less than ⅓ times the thickness of the housing 10, generation of deformation or stress in the functional part 11 is prevented more effectively by the grooves.

Figure 8A:
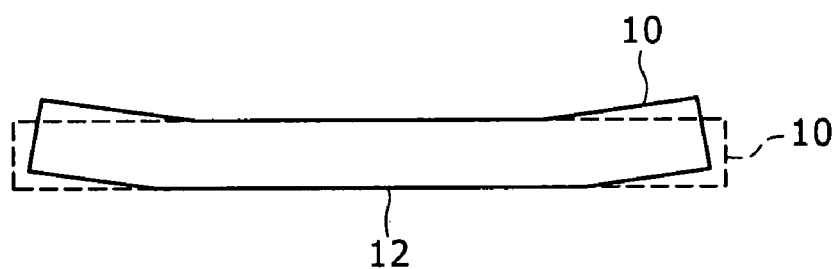
FIGS. 8A and 8B are sectional views showing the condition of deformation when the device is mounted.
Figure 8B:
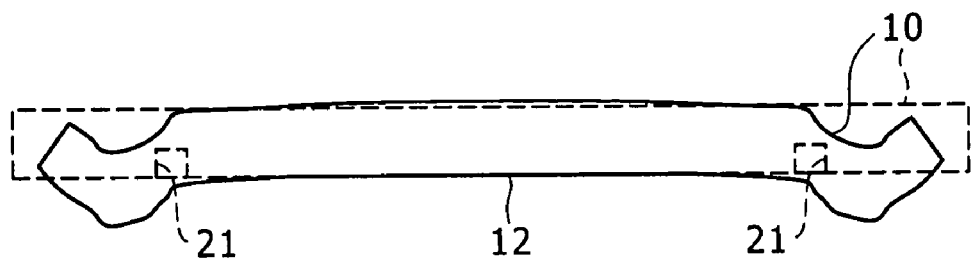
Figure 9:
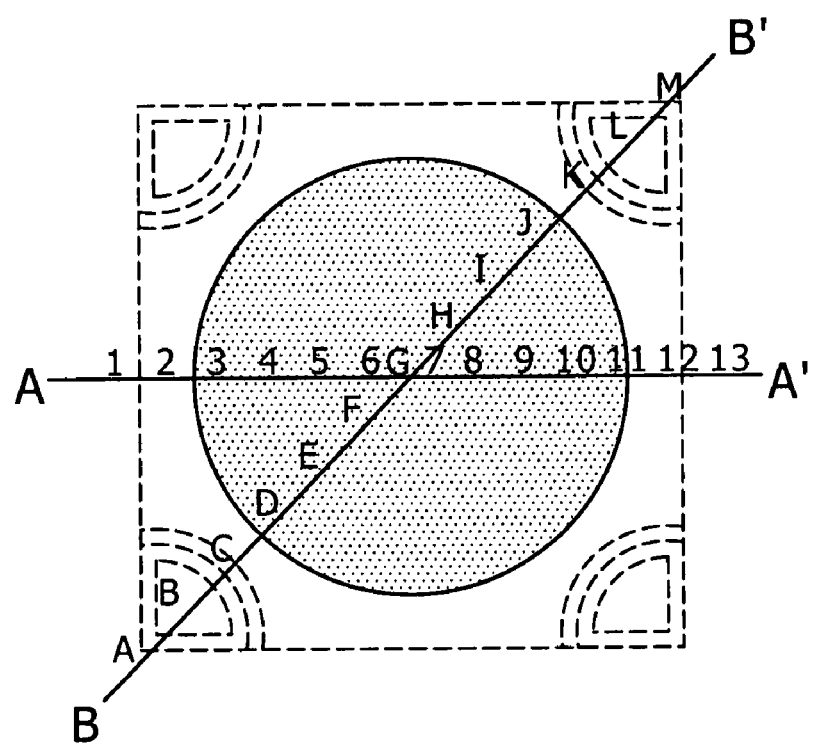
FIG. 9 is a graph showing addresses for measurement of warp.
Figure 10:
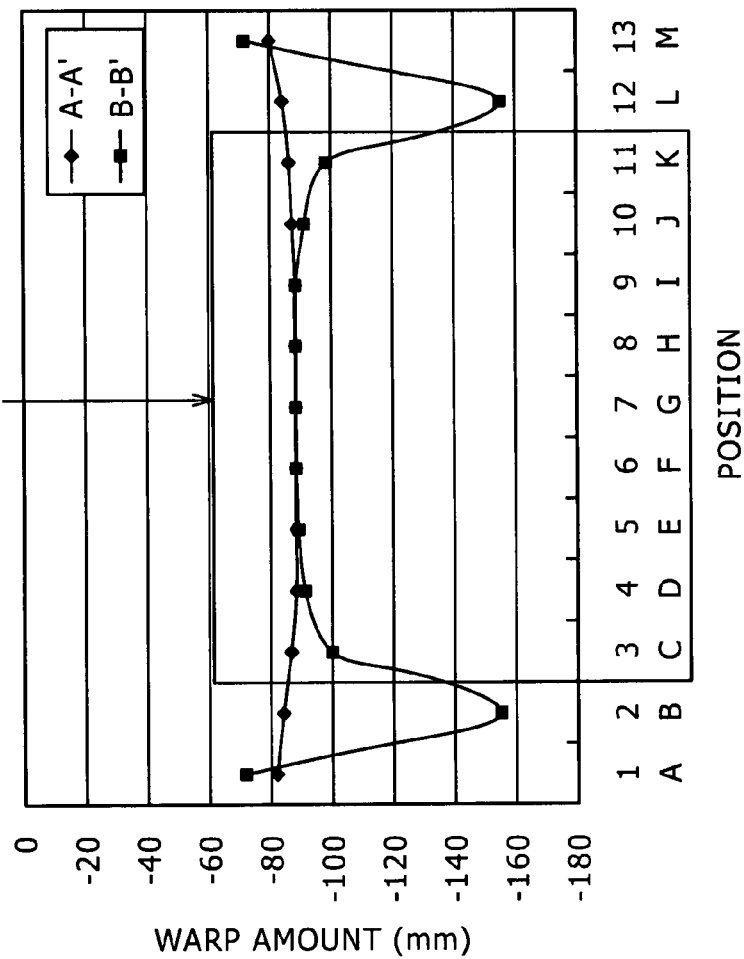
FIG. 10 shows a graph and a table for showing the deformation amount at each position.

When the micromachine provided with the grooves 21 so as to partition the functional part 11 and the mounting parts composed of recessed parts from each other as above is mounted on a mounting substrate, the micromachine will be deformed as shown in FIGS. 8A and 8B. The results of measurement of the condition of deformation in this case are shown in FIGS. 9 and 10. As is clear from these results, particularly, the portion of the functional part 11 of the housing 10 is warped little. Therefore, generation of a stress attendant on warp is also prevented. This indicates that the electrical characteristics of the functional part such as a micromachine, a semiconductor device, an IC, etc. are less liable to be influenced by a stress of the adhesive or solder upon mounting of the device or by a stress generated due to the difference between the coefficient of linear expansion of the adhesive or solder and that of silicon or GaAs used as a material of the functional part upon a change in temperature.

Embodiment 2

Figure 11:
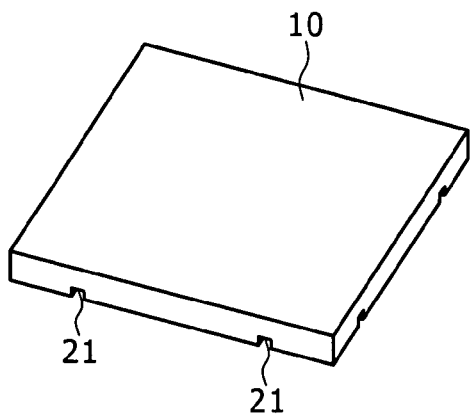
FIG. 11 is a perspective view of a device including a micromachine according to a second embodiment of the present invention.
Figure 12:
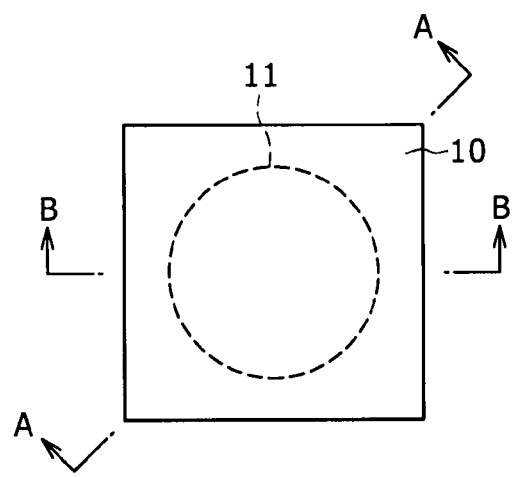
FIG. 12 is a plan view of the device.
Figure 13:
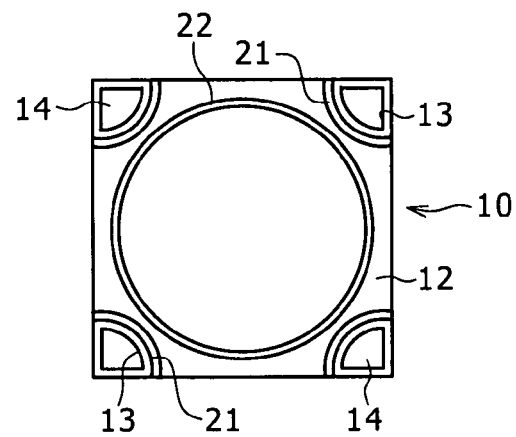
FIG. 13 is a bottom view of the device.
Figure 14:
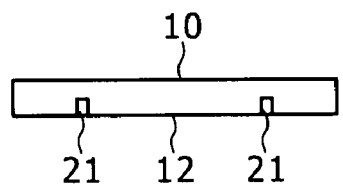
FIG. 14 is a side view of the device.
Figure 15:
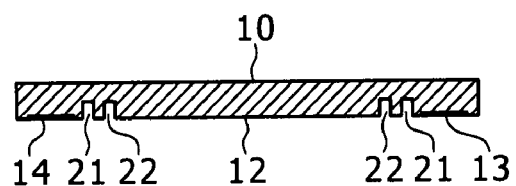
FIG. 15 is a sectional view taken along line A-A of FIG. 12 of the device.
Figure 16:
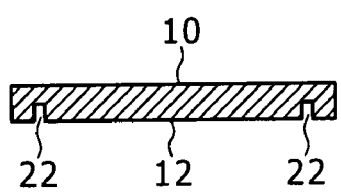
FIG. 16 is a sectional view taken along line B-B of FIG. 12 of the device.
Figure 17:
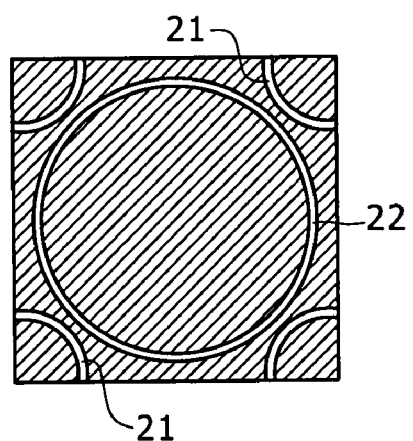
FIG. 17 is a horizontal sectional view of the device.

Now, a second embodiment of the present invention will be described below referring to FIGS. 11 to 17. In this embodiment, the functional part 11 of an electronic device is a micromachine, and the electronic device has a flat rectangular parallelepiped housing 10, as shown in FIG. 11. As shown in FIG. 12, the functional part 11 of the micromachine is provided at a central portion of the housing 10. In addition, as shown in FIG. 13, mounting parts to be coated with an adhesive or solder are provided at four corner parts of a mounting surface 12 constituting the lower surface of the housing 10. Incidentally, in this embodiment, the mounting parts are composed of shallow recessed parts 13 for retaining the adhesive 14.

Besides, first grooves 21 having an arcuate shape with a center angle of 90 degrees are formed so as to partition the mounting parts composed of the recessed parts 13, in the mounting surface 12 of the housing 10. Further, the mounting surface 12 is provided with a circular second groove 22 so as to surround the outer periphery of the functional part 11.

Incidentally, here, the shape of the housing 10 of the micromachine is square as shown in FIGS. 12 and 13, but the shape of the micromachine may be a rectangle. Further, while the shape of each of the first grooves 21 is a curved line, it may be a straight line. In addition, in this embodiment, the shape of the second groove 22 may be formed by connecting a plurality of straight lines. Besides, the second groove 22 may not necessarily surround the whole periphery of the functional part 11, but may surround a part of the periphery. The first grooves 21 and the second groove 22 may be formed by a deep silicon etching method, for example, a D-RIE method, a TMAH method, or a KOH method.

Figure 18A:
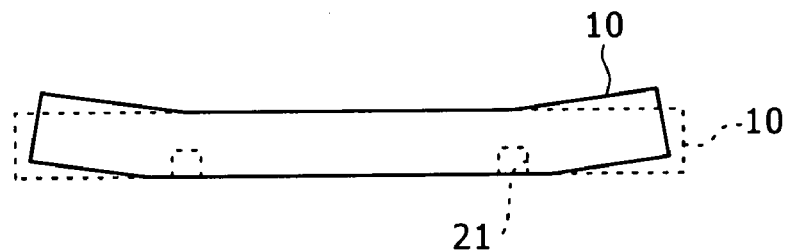
FIGS. 18A and 18B are sectional views showing the condition of deformation when the device is mounted.
Figure 18B:
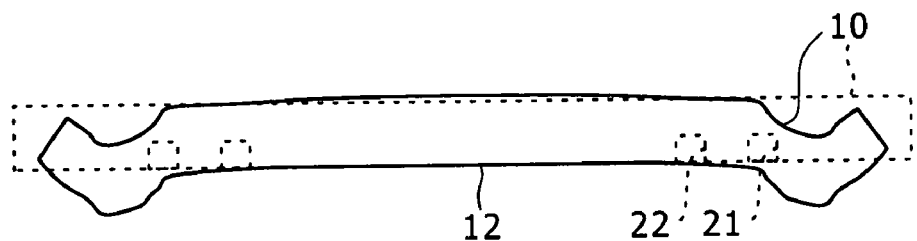
Figure 19:
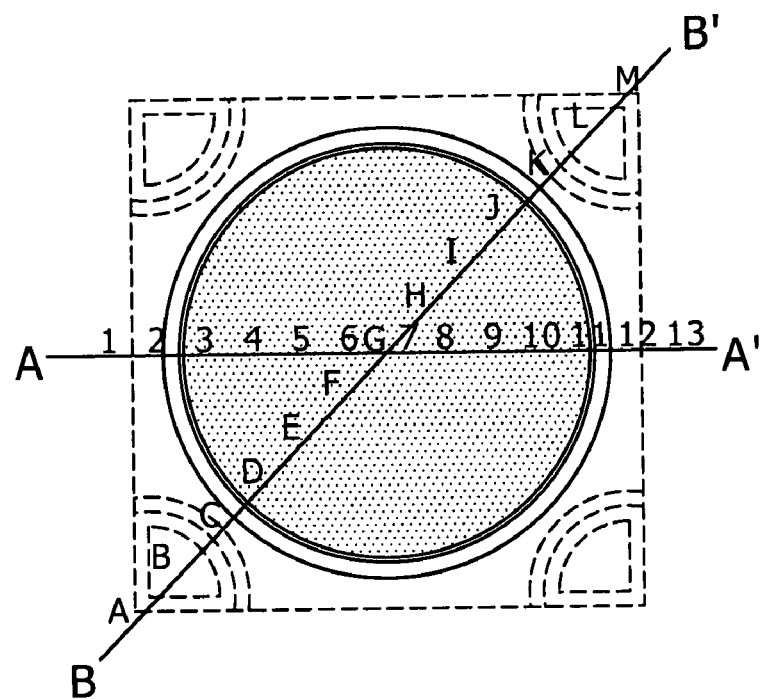
FIG. 19 is a graph showing positions (addresses) for measurement of warp.
Figure 20:
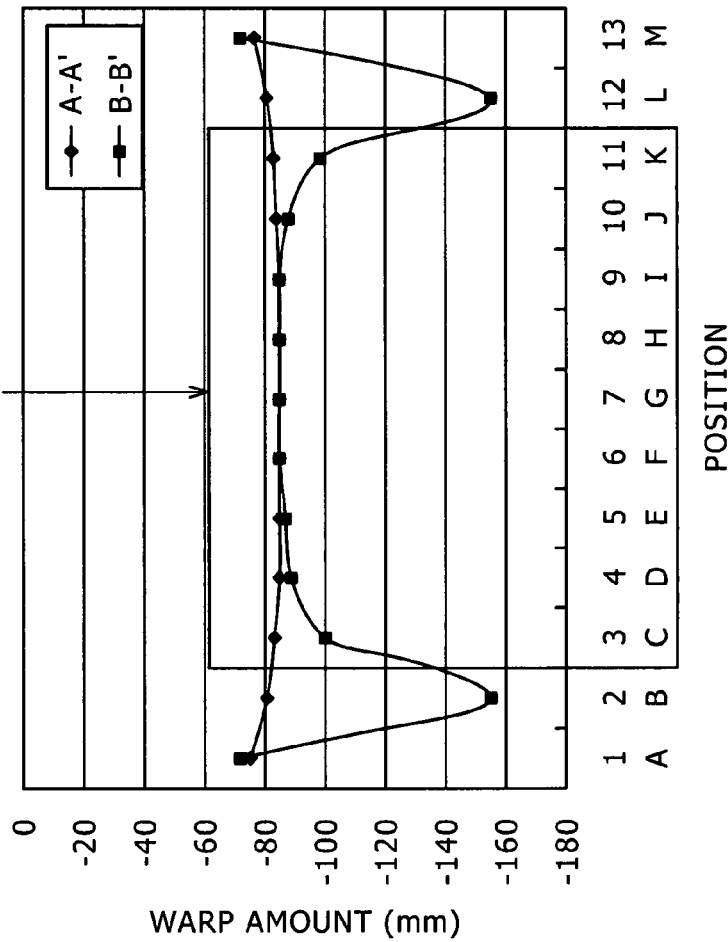
FIG. 20 shows a graph and a table for showing the deformation amount at each position.
Figure 21:
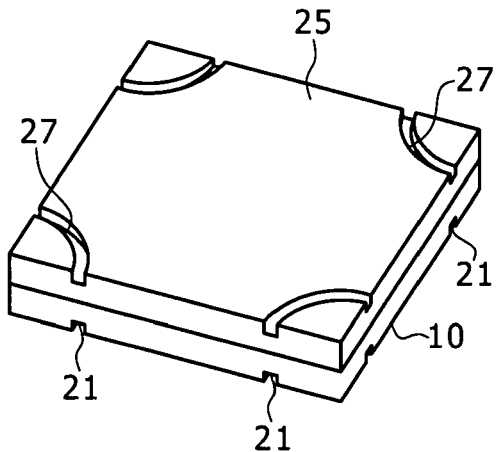
FIG. 21 is a perspective view of a device including a micromachine according to a third embodiment of the present invention.
Figure 22:
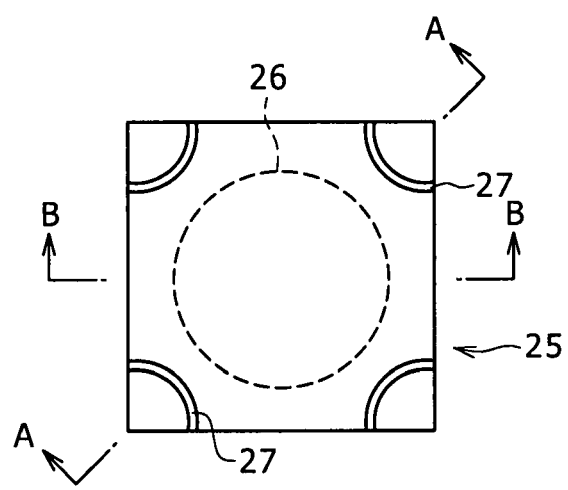
FIG. 22 is a plan view of the device.
Figure 23:
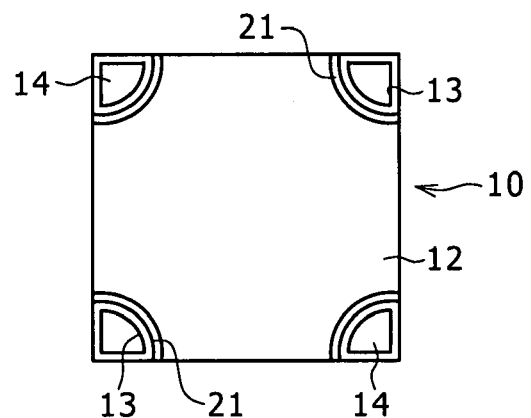
FIG. 23 is a bottom view of the device.
Figure 24:
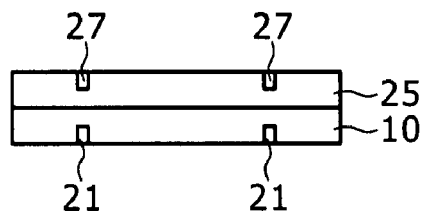
FIG. 24 is a side view of the device.
Figure 25:
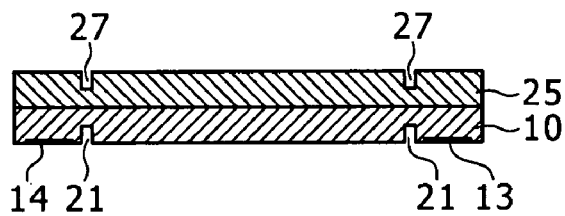
FIG. 25 is a sectional view taken along line A-A of FIG. 22 of the device.
Figure 26:
FIG. 26 is a sectional view taken along line B-B of FIG. 22 of the device.
Figure 27A:
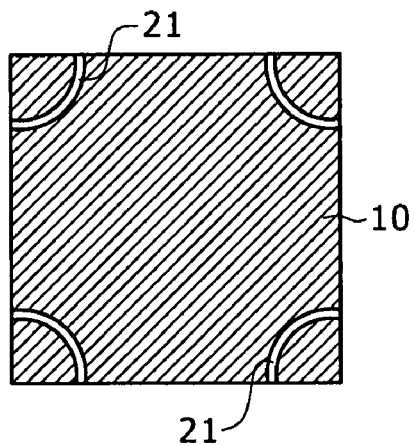
FIGS. 27A and 27B show horizontal sectional views of silicon chips.
Figure 27B:
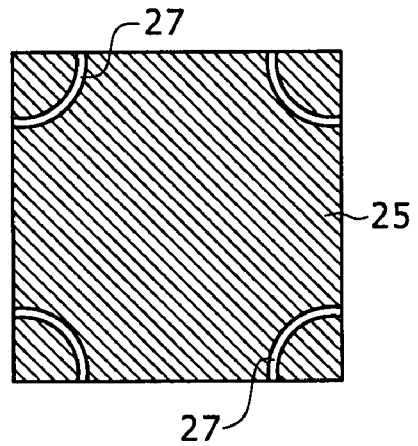

The shape of deformation in the case where the micromachine provided with the first grooves 21 and the second groove 22 is mounted in a ceramic package or on a mounting substrate is shown in FIGS. 18A and 18B. The warp generated when the micromachine to be deformed as above-mentioned upon mounting is mounted on a mounting substrate is shown in FIGS. 19 and 20. As is clear from the results, particularly, by the presence of the first grooves 21 and the second groove 22, the portion of the functional part 11 of the housing 10 is little warped attendant on the mounting, whereby it is ensured that the electrical characteristics are less liable to be influenced even if a stress of the adhesive or solder is generated upon mounting or if a stress is generated due to the difference between the coefficient of linear expansion of the adhesive or solder and that of the electronic device material upon a change in temperature.

Embodiment 3

Now, a third embodiment of the present invention will be described below referring to FIGS. 21 to 27. In this embodiment, an electronic device is formed by joining two silicon chips 10 and 25, the functional part in the electronic device is a micromachine, and the silicon chips 10 and 25 are provided respectively with the functional parts 11 and 26 at their central portions (see FIG. 22). A mounting surface 12 constituting the lower surface of the housing 10 on one side is provided with recessed parts 13 to be coated with an adhesive 14 (see FIGS. 23 and 25).

Further, here, the lower surface of the housing 10 on one side is provided with first grooves 21 having a center angle of 90 degrees so as to surround the mounting parts composed of the recessed parts 13. Besides, the silicon chip including the housing 25 on the opposite side of the housing 10, with the joint surface of the silicon chip 10 as a boundary surface, is also provided with first grooves 27 similar to the first grooves 21 formed in the same surface as the mounting parts of the micromachine.

Incidentally, here, the housings 10 and 25 are both square in shape, but the shape may be a rectangle. In addition, while the grooves 21 and 27 are arcuate in shape with a center angle of 90 degrees, they may be straight lines in shape. Besides, the grooves 21 and 27 may be formed by a deep silicon etching method, for example, a D-RIE method, a TMAH method, or a KOH method. Further, the joining of the two silicon chips 10 and 25 may be conducted by such joining methods of an anodic joining method, an Au—Au joining method, an Au—Sn joining method, a normal temperature joining method, etc.

Embodiment 4

Figure 28:
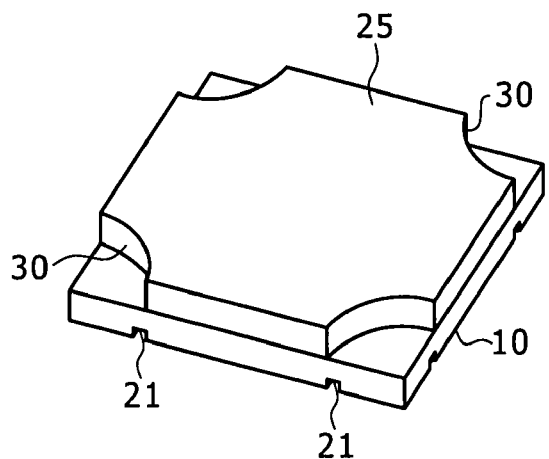
FIG. 28 is a perspective view of a device including a micromachine according to a fourth embodiment.
Figure 29:
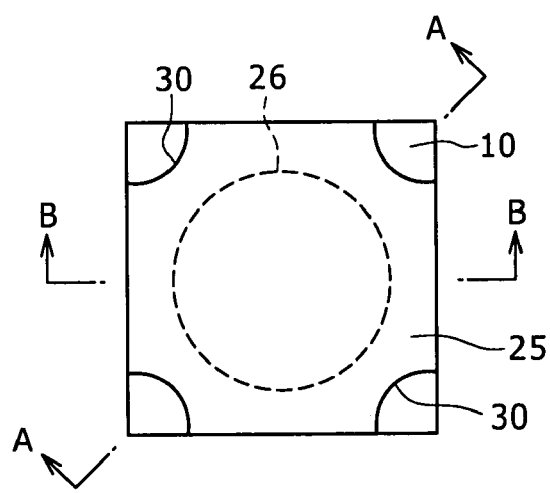
FIG. 29 is a plan view of the device.
Figure 30:
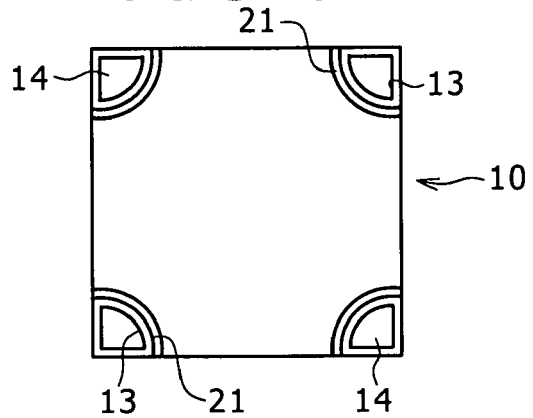
FIG. 30 is a bottom view of the device.
Figure 35:
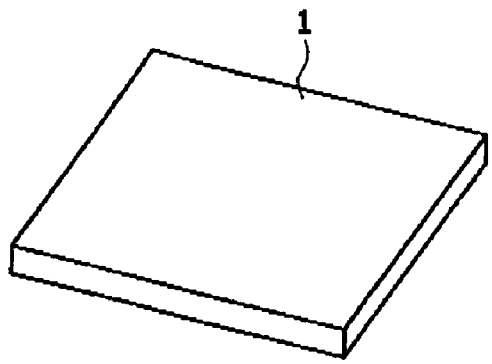
FIG. 35 is a perspective view of an electronic device including a micromachine according to the related art.
Figure 36:
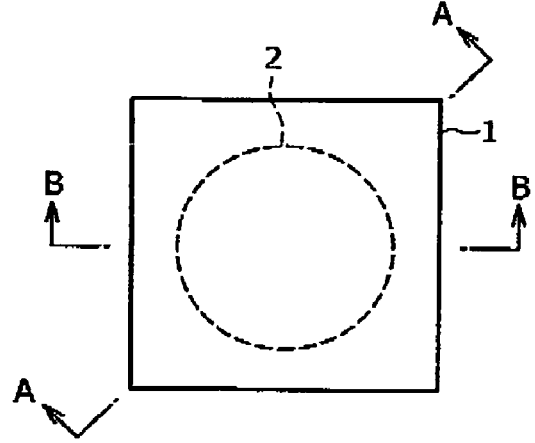
FIG. 36 is a plan view of the device.
Figure 37:
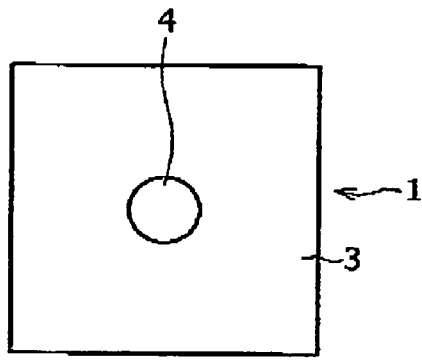
FIG. 37 is a bottom view of the device.
Figure 38:
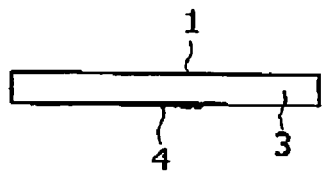
FIG. 38 is a side view of the device.
Figure 39:
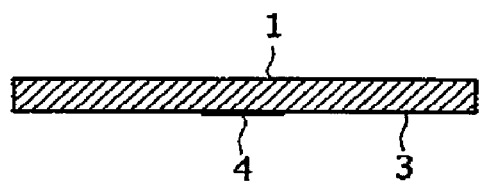
FIG. 39 is a sectional view taken along line A-A of FIG. 36 of the device.
Figure 40:
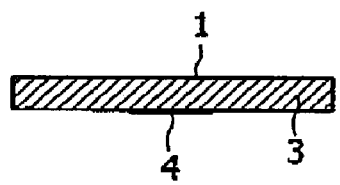
FIG. 40 is a sectional view taken along line B-B of FIG. 36 of the device.
Figure 41:
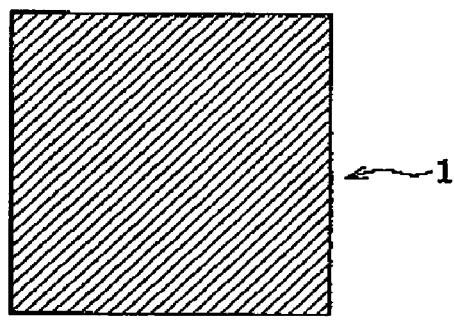
FIG. 41 is a horizontal sectional view of the device.
Figure 42A:
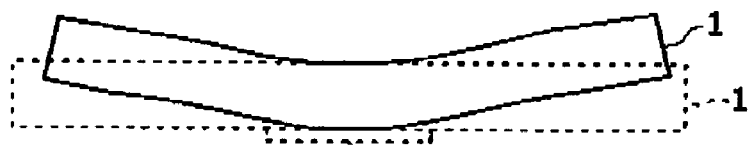
FIGS. 42A and 42B are sectional views showing deformation due to a stress attendant on adhesion when the device is mounted on a mounting substrate.
Figure 42B:
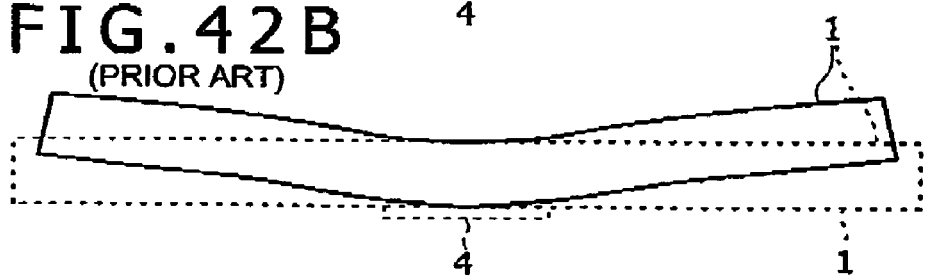
Figure 43:
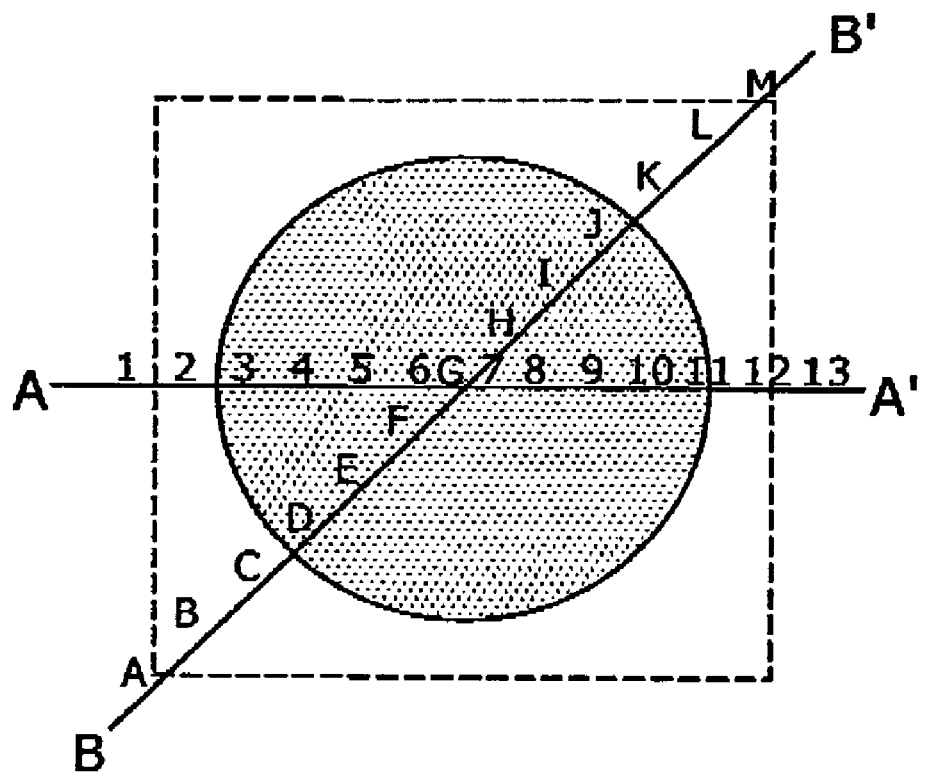
FIG. 43 is a graph showing positions (addresses) for detection of the warp amount at each position.
Figure 44:
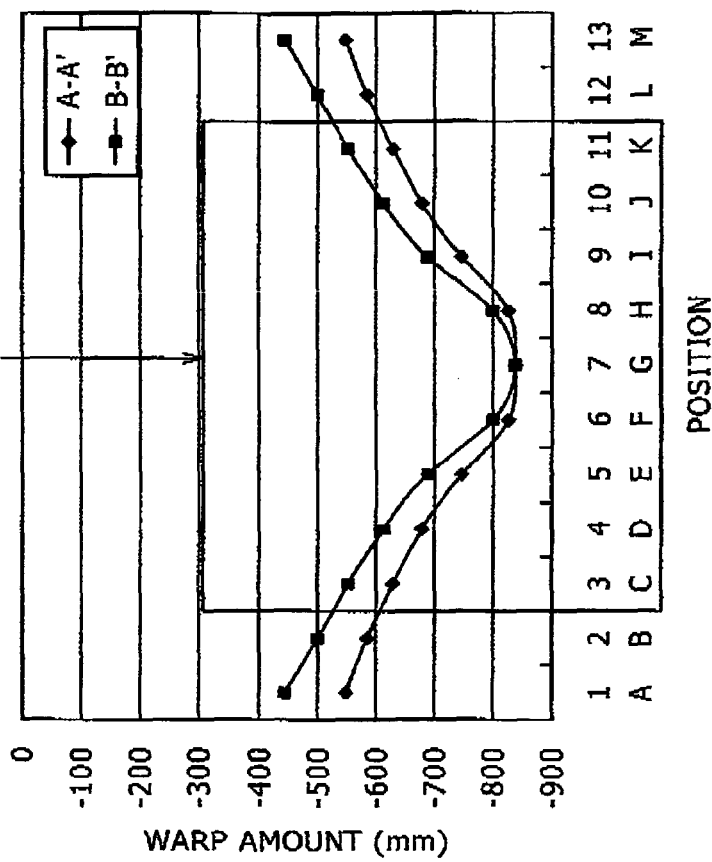
FIG. 44 shows a graph and a table for showing the relationship between position and warp.

Now, a fourth embodiment of the present invention will be described below referring to FIGS. 28 to 34. In this embodiment, a micromachine is formed by laminatingly joining two silicon chips 10 and 25 to each other as shown in FIG. 28, and functional parts 11 are formed respectively at substantially central parts of the housings 10 and 25 as shown in FIG. 29. Particularly, as shown in FIG. 30, mounting parts for constituting adhesive- or solder-coated parts are laid out at corner portions of a mounting surface 12 of the housing 10. Further, the mounting surface 12 of the housing 10 is provided with arcuate first grooves 21 so as to partition the mounting parts composed of the recessed parts 13. The grooves 21 have a depth of not less than ⅙ times the thickness of the housing 10.

The housing 25 on the other side, to be joined to the silicon chip composed of the housing 10, is provided with cutouts 30 lacking the parts on the outside of the positions corresponding to the first grooves 21 in the housing 10. In other words, the silicon chip composed of the housing 25 on the upper side has a shape lacking the parts corresponding to the mounting parts of the silicon chip composed of the housing 10 on the lower side.

In this embodiment, the chips 10 and 25 constituting the micromachine are both square in shape, but they may be rectangular in shape. In addition, while the shape of each of the first groove 21 is a curved line in this embodiment, the shape may be a straight line. The formation of the grooves 21 and the formation of the cutouts 30 may each be conducted by any of various etching methods such as a deep silicon etching method, for example, a D-RIE method, a TMAH method, or a KOH method. Besides, the joining of the two or more silicon chips may be conducted by any of various joining methods such as a silicon joining method, for example, an anodic joining method, an Au—Au joining method, an Au—Sn joining method, or a normal temperature joining method.

In this embodiment, particularly, by the presence of the grooves 21 and the cutouts 30, it is ensured that the electrical characteristics of the functional parts of the two chips 10 and 25 are less liable to be influenced by a stress generated in the functional parts due to the adhesive or solder upon mounting or due to the difference between the coefficient of linear expansion of the adhesive or solder and that of the electronic device material upon a change in temperature.

While the present invention has been described referring to the embodiments shown in the drawings, the invention is not limited to the above embodiments, and various modifications are possible within the scope of the technical thought of the invention. For example, in the third embodiment or the fourth embodiment, either one or both of the silicon chips 10 and 25 may be provided with a circular second groove 22 such as to surround the functional part 11. Besides, the present invention is applicable not only to micromachines but also to semiconductor devices and ICs.

It should be understood by those skilled in the art that various modifications, combinations, sub-combinations and alterations may occur depending on design requirements and other factor in so far as they are within the scope of the appended claims or the equivalents thereof.

What is claimed is:

1. An electronic device comprising a functional part provided on a housing, wherein
    a mounting surface of said housing is provided with a groove for partitioning from each other a mounting part and a region corresponding to a functional part, wherein said groove has a depth of not less than ⅙ times the thickness in a direction orthogonal to said mounting surface of said housing, and further wherein groove portions extend around a plurality of corner portions of the mounting surface.

2. The electronic device as set forth in claim 1, wherein said functional part is a micromachine.

3. The electronic device as set forth in claim 1, wherein said functional part is a semiconductor device.

4. The electronic device as set forth in claim 1, wherein said functional part is an IC (integrated circuit device).

5. The electronic device as set forth in claim 1, wherein said housing is rectangular in shape, one principal surface of said housing constitutes said mounting surface, and said mounting part is provided in the vicinity of a corner part of said mounting surface with the groove extending from one side to another around the mounting part.

* * * * *